(12) United States Patent
Allred et al.

(10) Patent No.: US 6,721,428 B1
(45) Date of Patent: Apr. 13, 2004

(54) AUTOMATIC LOUDSPEAKER EQUALIZER

(75) Inventors: Rustin W. Allred, Plano, TX (US); Robert S. Young, Jr., Austin, TX (US); Michael Tsecouras, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/191,944

(22) Filed: Nov. 13, 1998

(51) Int. Cl.$^7$ ................................................ H03G 5/00
(52) U.S. Cl. ........................................................ 381/103
(58) Field of Search .......................... 381/56, 57, 58, 381/59, 103, 107, 97; 700/94; 708/322 F (56) References Cited

U.S. PATENT DOCUMENTS

| | | | | |
|---|---|---|---|---|
| 5,337,368 A | * | 8/1994 | Kikuchi et al. | 381/103 |
| 5,495,501 A | * | 2/1996 | Iwamatsu et al. | 375/232 |
| 5,506,910 A | * | 4/1996 | Miller et al. | 381/103 |
| 5,581,621 A | * | 12/1996 | Koyama et al. | 381/103 |
| 6,072,879 A | * | 6/2000 | Ouchi et al. | 381/61 |

OTHER PUBLICATIONS

Hirohisa Yamaguchi and Yoshito Higa, "Digital–Signal–Processing Acoustic Speaker System" Tsukuba Research & Development Center, Texas Instruments.
Robert Bristow–Johnson, "The Equivalence of Various Methods of Computing Biquad Coefficients for Audio Parametric Equalizers"*AES*, 97$^{th}$ Convention, pp. 1–10, Nov. 1994.
Sophocles J. Orfanidis, "Digital Parametric Equalizer Design with Prescribed Nyquist–Frequency Gain"*AES*, 101$^{st}$ Convention, pp. 1–13, Nov. 8–11, 1996.
Udo Zolzer and Thomas Boltze, "Parametric Digital Filter Structures" *AES*, 99$^{th}$ Convention, pp. 1–12, Oct. 6–9, 1995.
R. W. Allred, "Target Intensity and Location Estimator" *Proc. IRIS Passive Sensors*, vol. II, pp. 393–400, 1996.
Yoseph Linde, Andres Buzo, Robert M. Gray, "An Algorithm for Vector Quantizer Design" *IEEE*, vol. COM–28, No. 1, pp. 84–95, Jan. 1980.

* cited by examiner

*Primary Examiner*—Duc Nguyen
*Assistant Examiner*—Lun-See Lao
(74) *Attorney, Agent, or Firm*—J. Dennis Moore; W. James Brady, III; Frederick J. Telecky, Jr.

(57) ABSTRACT

A method for generating digital filters for equalizing a loudspeaker. First digital data is provided, for a tolerance range for a target response curve of sound level versus frequency for the loudspeaker. Second digital data is generated, for an actual response curve of sound level versus frequency for the loudspeaker. The first digital data is compared with the second digital data and it is determined whether the actual response curve is within the tolerance range. If the actual response curve is not within the tolerance range, digital audio filters are iteratively generated, and the digital audio filters are applied to the second digital data to generate third digital data for a compensated response curve. The frequency, amplitude and bandwidth of the digital audio filters are automatically optimized until the compensated response curve is within the tolerance range or a predetermined limit on the number of digital audio filters has been reached, whichever occurs first.

16 Claims, 8 Drawing Sheets

AUTOMATIC LOUDSPEAKER EQUALIZER

TECHNICAL FIELD OF THE INVENTION

This invention relates to audio systems, and more particularly relates to equalization of loudspeakers.

BACKGROUND OF THE INVENTION

For a loudspeaker or, simply, speaker, to render high quality audio, inherent variations with frequency in the amplitude, or sound level, of the sound reproduced by the speaker for a given level of signal driving the loudspeaker must be normalized. This process is known as speaker equalization. Traditionally, the design of equalizers has been performed by an experienced technician who uses precision instruments to measure the speaker characteristics and adjusts filters as needed to equalize the speaker. In this way, the spectral performance of the loudspeaker is compensated so that for a given audio signal power level the amplitude of the resulting sound is approximately the same for all audio frequencies in the performance range of the loudspeaker. Such a procedure is manual, time-consuming and requires significant expertise but still does not necessarily yield the best equalization possible for the resources expended.

More recently, automated equalization schemes have been proposed. For example, one such proposed scheme is an automated graphic equalizer. Such an equalizer has a plurality of channels having fixed center frequencies and fixed Qs (ratio of center frequency to bandwidth of the channel) that cover the entire audio band with filters. It has been proposed to automate the equalization process with such an equalizer by using instruments to record the spectral behavior of a loudspeaker in an environment, and then, in an automated fashion apply to varying degrees such filters so as to compensate the loudspeaker performance and thus bring the resulting spectral behavior of the loudspeaker more closely to a target curve. The approach is limited in its capacity for optimization, and the equalizer is complex, making this approach impractical for widespread use in, e.g., low cost consumer audio products. Also, there is no provision for automatically refining the optimization.

Another proposed scheme proposes equalizing a sound field by automatically deriving an inverse filter that is embodied in a combination of fast Fourier transforms (FFTs) and finite impulse response (FIR) filters. The inverse filter implementation is quite complex, however, requiring considerable resources, thus making this approach impractical also for widespread use in, e.g., consumer audio products. In addition, there is no provision for re-optimization in this scheme, either.

Therefore, it would be desirable to have a method and/or apparatus for the automatic equalization of a loudspeaker that does not involve excessive complexity in implementation. It would also be desirable to have a method and/or apparatus for the automatic equalization of a loudspeaker that automatically re-optimizes the equalization. The present invention provides such a method and apparatus.

SUMMARY OF THE INVENTION

The present invention provides a method for generating digital filters for equalizing a loudspeaker. First digital data is provided, for a tolerance range for a target response curve of sound level versus frequency for the loudspeaker. Second digital data is provided, for an actual response curve of sound level versus frequency for the loudspeaker. The first digital data is compared with the second digital data and it is determined whether the actual response curve is within the tolerance range. If the actual response curve is not within the tolerance range, digital audio filters are iteratively generated, and modified data relating to the response of said loudspeaker modified by said digital audio filters is generated. The frequency, amplitude and bandwidth of the digital audio filters are automatically optimized until the modified data is within the tolerance range or a predetermined limit on the number of digital audio filters has been reached, whichever occurs first.

These and other features of the invention will be apparent to those skilled in the art from the following detailed description of the invention, taken together with the accompanying drawings.

DETAILED DESCRIPTION OF THE PREFERRED EMBODIMENT

Figure 1:
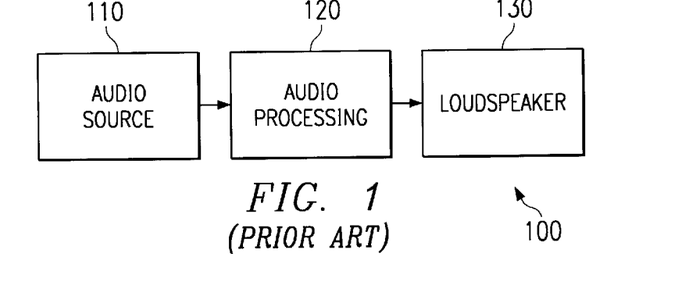
FIG. 1 is a high level block diagram of a typical prior art audio system.

A typical prior art audio system 100 is shown in FIG. 1. The system 100 is comprised of an audio source 110, audio processing functionality 120, and at least one loudspeaker system 130. It is assumed that the necessary amplification is provided within the loudspeaker system 130.

Figure 2:
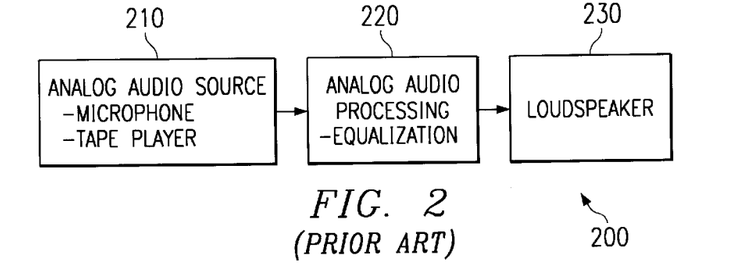
FIG. 2 is block diagram of a typical prior art analog audio system.

Previously, such systems have been completely analog as is shown in the analog audio system 200 of FIG. 2. In FIG. 2 an analog audio source 210, such as, e.g., a microphone, radio tuner or tape player, provides an electrical signal to the analog audio processing function 220, which includes any equalization function. The signal output from the analog audio processing function 220 is then played through the loudspeaker system 230.

Figure 3:
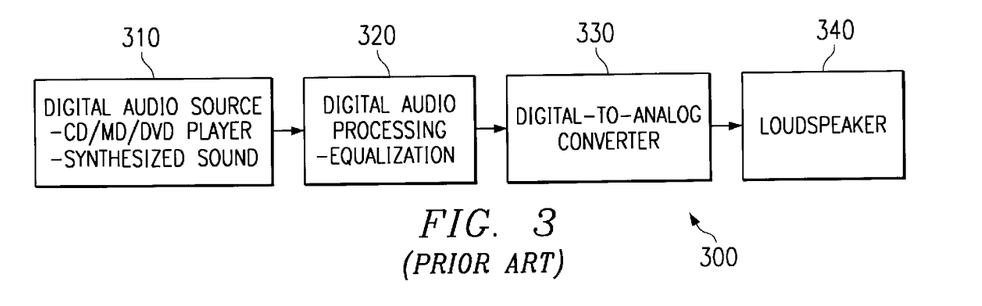
FIG. 3 is a typical prior art digital audio system.

Currently, audio systems are becoming increasingly digital. A conceptual digital system 300 is shown in FIG. 3. This digital audio system 300 is actually comprised of both analog and digital elements since the loudspeaker system 340 is necessarily analog. However, this is referred to as a digital system since the audio signals are all digital prior to reconstruction and playback. The digital audio system 300 is comprised of a digital audio source 310, such as a compact disk, mini-disk, DVD or a synthesized sound source. The signal output from the digital audio source 310 is provided to a digital audio processing function 320, where it is digitally processed. Such digital processing may include equalization. Once the digital processing is completed, the signal is converted back to analog by a digital-to-analog converter ("D/A") 330. The resulting analog signal is played back through the loudspeaker system 340.

Figure 4:
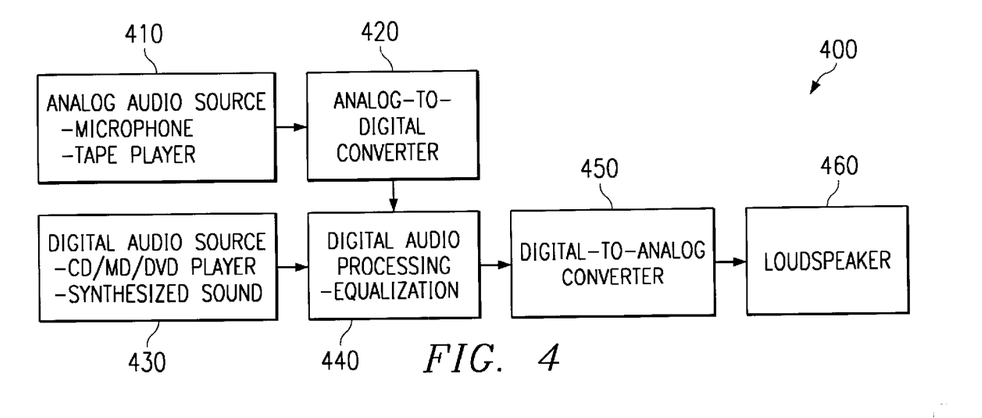
FIG. 4 is a combined analog and digital audio system.

At the current time, many audio systems contain digital portions, as well as analog portions in addition to a D/A and loudspeaker system. FIG. 4 shows an analog/digital audio system 400. This system 400 contains both an analog audio source 410, such as a microphone or tape player, and a digital audio source 430, such as a compact disk, mini-disk, DVD or a synthesized sound source. Now, to appropriately combine signals from such different sources, either the digital signal needs to be converted to analog, or the analog signal needs to be converted to digital. The audio system 400 of FIG. 4 is an embodiment of the latter type of system: the analog signals are converted to digital by an analog-to-digital converter ("A/D") 420, and all audio processing is accomplished in the digital domain, in a digital audio processing and equalization unit 440. After audio processing, the signal is converted back to analog by a D/A 450, and played back through the loudspeaker system 460.

Of the various audio system architectures discussed above, the audio system of FIG. 4 offers the most flexibility for audio processing. This is due to the ease with which digital signals can be processed. Whereas analog signal processing is limited by the lack of analog components to perform many mathematical functions, digital signal processing allows the application of almost any mathematical function to digital signals, although speed and cost constraints limit this flexibility to some degree.

Due to this flexibility, the current trend in audio processing is toward digital functionality. The preferred embodiment of the present invention presents a novel method of equalization, including an automatic method for calculating filter equalization coefficients and applying them in the digital domain.

In a more general sense than discussed above, speaker equalization is the process of modifying an audio signal prior to playback by the loudspeaker in order to create some desired speaker response that is the intrinsic speaker response effectively shaped to the desired response by the influence of the equalization process on the audio signal. Often a flat response is desirable since it allows the sound spectrum to pass through the speaker without audible degradation. However, the method of the present invention is also capable of equalizing to something other than a flat spectrum. For example, the sound spectrum might be shaped in some way because of deficiencies in the speaker itself, to create a particular sound effect, to enhance intelligibility of a signal, or to compensate for the listening environment or for the listener's particular hearing characteristics and/or listening preferences or desires.

As discussed above, speaker equalization can be performed in either the analog or the digital domain. However, current trends in audio processing highlight the need for the inexpensive, highly-flexible, readily-adaptable, digital domain equalization capability.

Figure 5:
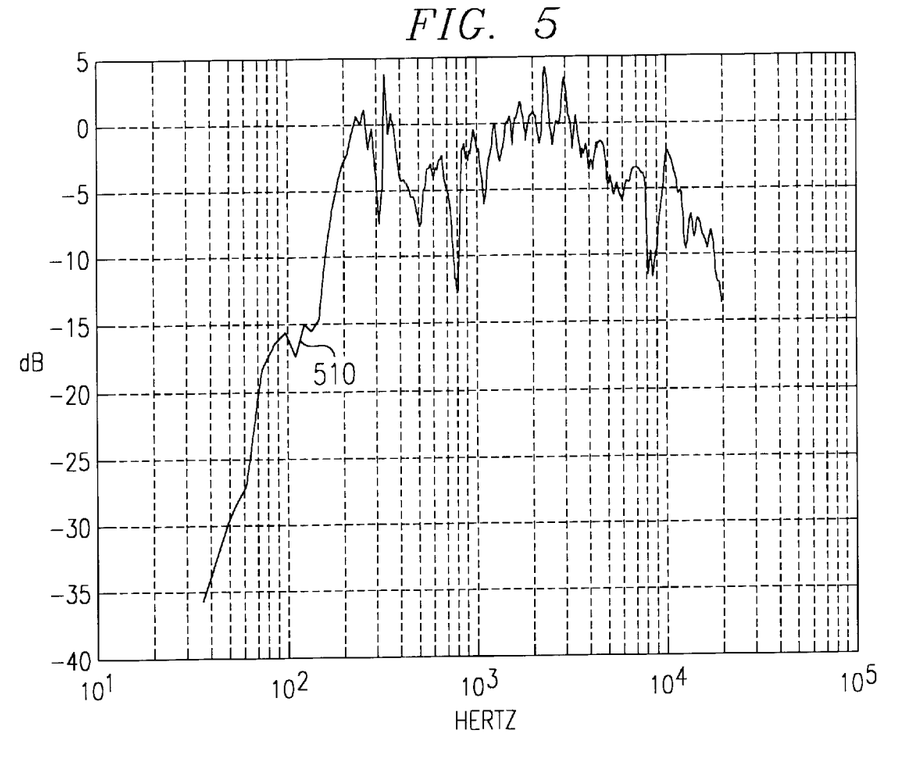
FIG. 5 is a graph showing a typical speaker response.

FIG. 5 is a graph in which the horizontal axis represents frequency in Hertz and the vertical axis represents sound level in decibels, showing a typical speaker response curve 510. This curve 510 shows the sound pressure level of a speaker as a function of frequency. A speaker with the characteristic shown in FIG. 5 has very little response to frequencies below 200 Hz and so it is fair to say that the bass response is significantly degraded. Furthermore, input frequencies above 200 Hz show a wide variety of responses across the spectrum. Such a speaker response will significantly distort the sound spectrum; and this distortion will be noticeable to the listener. This invention supplies a method for correcting this problem that may be readily implemented in a relatively low cost system including a multi-purpose digital signal processor, or other circuitry.

Figure 6:
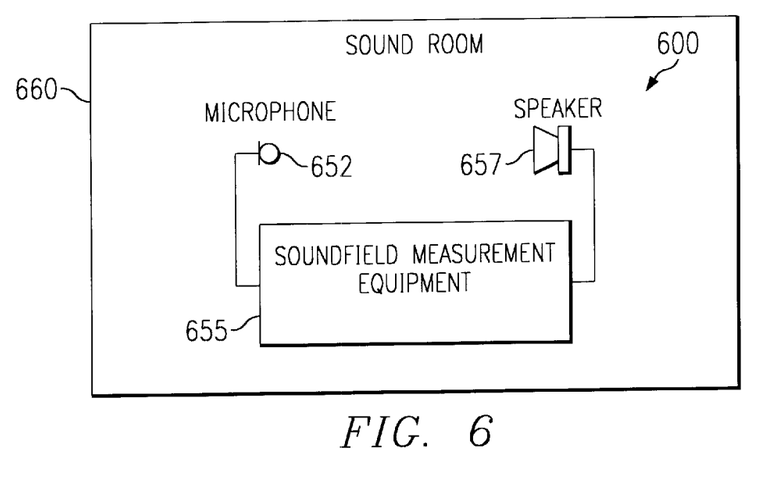
FIG. 6 is a typical prior art speaker measuring system.

The speaker response curve 510 shown in FIG. 5 is computed with a speaker response measuring system 600 such as that shown in FIG. 6. In generating such a curve, sound field measurement equipment 655, which may be a maximum-length sequence system analyzer system, or any other suitable system, sends an audio electrical signal to a speaker 657. The sound output of the speaker from that audio signal is received via a microphone 652 located in proximity to the speaker 657, and the resulting audio signal generated by the microphone 652 is sent to the sound field measurement equipment 655. There it is processed to compute the sound level across the audio spectrum and generate a corresponding sound level response curve, such as curve 510 in FIG. 5. The system 600 is typically deployed inside a suitable sound room 660 which minimizes sound reflections, so the measurement records only the speaker's performance without the influence of echoes and other environmental effects.

Figure 7:
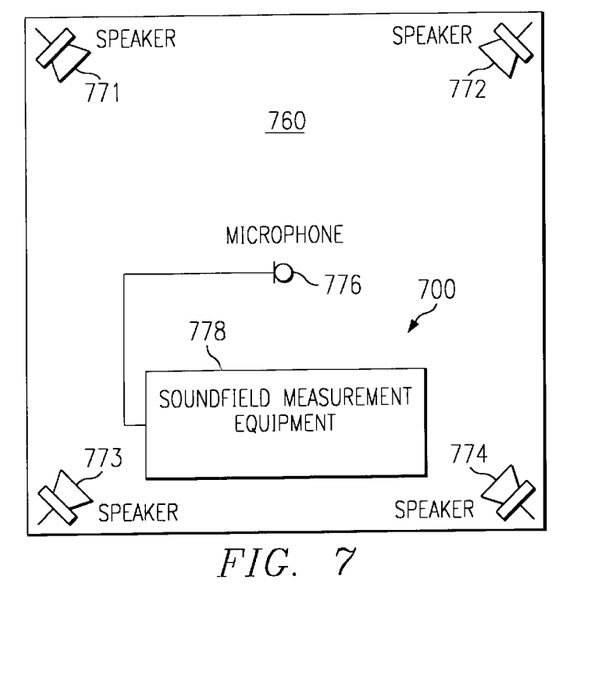
FIG. 7 is a typical prior art room measuring system.

On the other hand, in some circumstances it is desirable to measure the response of a listening environment. A room response measuring system 700 to accomplish this task is shown in FIG. 7. In this case, speakers are deployed about the environment 760 to be measured, which could be any listening environment, such as, for example, a room, a stadium, or an automobile. Sound from the measurement equipment, 778, is played through any desired number of speakers, four speakers 771, 772, 773, 774 being shown in FIG. 7. The sound from the speakers, including effects from the environment 760, is received by the microphone 776, and the resulting audio signal is sent to the measurement equipment, 778, for processing. This process might be repeated for various locations within the environment to 'map' the sound field.

Figure 8:
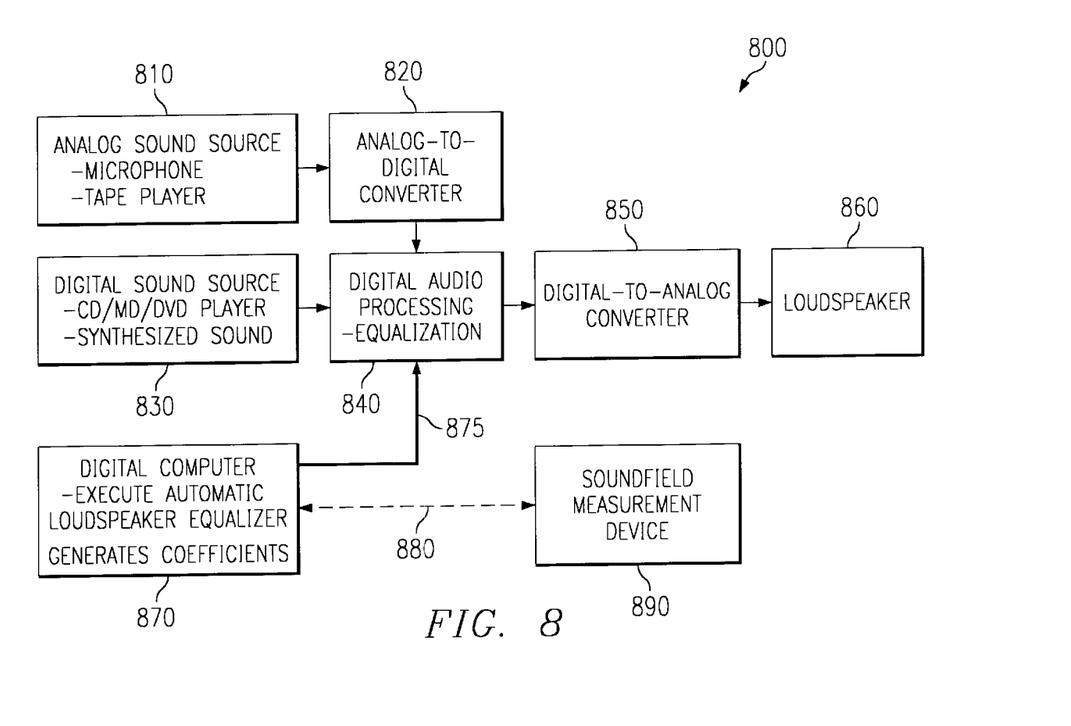
FIG. 8 is a diagram showing an audio system with an attached automatic loudspeaker equalizer.

FIG. 8 shows an audio system 800 with an attached automatic loudspeaker equalizer. System 800 is like the system 400 of FIG. 4. Thus, System 800 contains both an analog audio source 810, such as a microphone or tape player, and a digital audio source 830, such as a compact disk, mini-disk, DVD or a synthesized sound source. The analog signals are converted to digital by an analog-to-digital converter ("A/D") 820, and all audio processing is accomplished in the digital domain, in a digital audio processing and equalization unit 840. After audio processing, the signal is converted back to analog by a D/A 850, and played back through the loudspeaker system 860.

However, also included is a link 875 to a digital computer 870 which is, in turn, connected by link 880 to a sound field measurement device, 890. The digital computer 870 need not be permanently attached to the audio system 800, although it might be, such as in the case of audio systems on personal computers. New equalization filter coefficient updates for the digital audio processing and equalization unit 840 are provided on link 875. Thus, the system 800 can be modified to accommodate different speakers, different conditions and environments, and different listening preferences.

The sound field measurement device, 890, likewise need not always be linked to the computer 870 where the automatic loudspeaker equalizer is hosted. However, the loudspeaker or sound field characteristic information is needed by the automatic loudspeaker equalizer in the computer 870 in order to compute the correction coefficients, as described in detail below. Leaving the computer and the sound field measurement device permanently connected allows real time sound field correction in a manner significantly simpler than proposed in the prior art.

Figure 9:
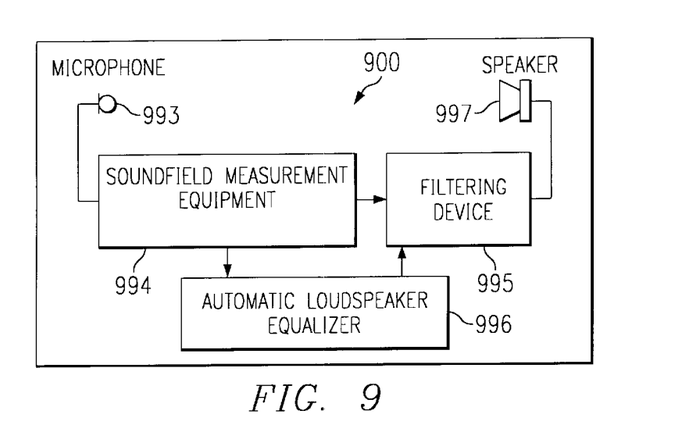
FIG. 9 is a diagram showing a closed loop acoustic response measuring system.

FIG. 9 shows a closed loop acoustic response measuring system 900. The purpose of this configuration is to allow applying the computed equalization in the measurement path in order to verify the effectiveness of the correction and to fine tune it. This is desirable since speakers are not truly linear devices and, therefore, do not necessary respond to an initial correction as predicted. In system 900, a sound field measurement device 994 sends a digital audio signal through a filtering device 995 to a speaker 997. The filtering device 995 applies digital filters to the digital audio signal received from the sound field measurement device 994. The filtering device 995 also includes a D/A converter for converting the resultant filtered digital audio signal to an analog signal suitable for the speaker 997. The speaker output is sound that is sensed by a microphone 993. The microphone sends an analog audio signal back to the measurement device 994 where it is converted by an analog to digital converter to a digital audio signal to be provided to the filtering device 995, and so on.

The first time through this sequence the filtering device 995 has its filter coefficients set as all-pass filters, meaning the filters do not affect the sound level characteristic of the speaker. Once the initial measurement has been made, an automatic loudspeaker equalizer 996 similar to equalizer 870 of FIG. 8 determines a set of filter coefficients to equalize the speaker being measured. Methods for determining these coefficients are discussed below.

The coefficients thus determined are transmitted to the filtering device 995, where they are used to change the characteristics of the filters applied to the digital audio signal. The measurement cycle is performed again with these new coefficients in place. The new measurement shows the improvement made by the filters thus calculated. If the new measurement shows the need for further correction, the automatic equalizer 996 computes additional coefficients and the cycle is repeated.

The equalization coefficients for the system of FIGS. 8, and 9, may be generated in a digital computer using a novel automatic loudspeaker equalizer algorithm. A flow chart for this algorithm is shown in FIG. 10.

Figure 10:
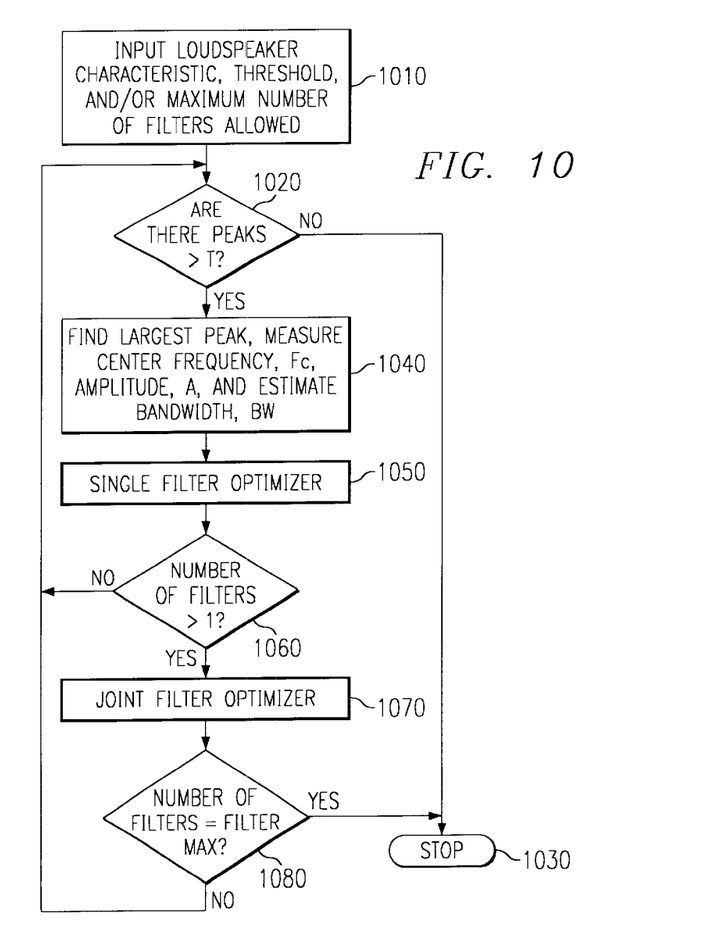
FIG. 10 is a flow chart showing an automatic loudspeaker equalizer algorithm.

Preferably, a second order infinite impulse response ("IIR") equalization filter algorithm is used as the digital filter algorithm for the algorithm shown in FIG. 10. On the other hand, the particular method for determining the coefficients of such second order IIR equalization filters is not of critical importance to the invention. Any digital filter algorithm for generating filters having controllable amplitude, A, center frequency, Fc, and bandwidth, BW, determined by the coefficients of the equations specifying the filters, may be used in this method. In addition, the method for estimating A, Fc and BW is not critical, since the single filter optimizer, described below, subsequently adjusts these values. Furthermore, it should be understood that FIR filter or other techniques may be employed, if so desired.

In the preferred embodiment the value of Fc is initialized to the frequency where maximum deviation from the desired response curve occurs, e.g., as found in step 1020, below, and A is initialized to the negative of that maximum deviation. BW is estimated by determining the 3 dB dropoff point from the maximum deviation, and using that.

For example, suitable methods for determining the filter coefficients are disclosed in Orfanidis, S J, "Digital Parametric Equalizer Design with Prescribed Nyquist-Frequency Gain," $101^{st}$ Audio Engineering Society Convention, 4361 (I-6), Nov. 8–11, 1996, Los Angeles, Calif., and in Bristow-Johnson, R., "The Equivalence of Various Methods of Computing Biquad Coefficients for Audio Parametric Equalizers," AES, $97^{th}$ Convention, 3966 (K-6), November 1994, are both applicable. The method of Zolzer and Boltze ($99^{th}$ Convention of AES, Oct. 6–9, 1995) (hereinafter referred to as "the Zolzer and Boltze article") is also applicable, and is perhaps more readily comprehended. It provides a method for generating coefficients for a five coefficient biquadratic discrete-time filter. Key aspects of the method presented in the Zolzer and Boltze article are summarized here, for exemplary purposes:

Let:

Fs=sample rate,

Fc=center frequency,

BW=filter bandwidth, and $$V_0 = \text{filter gain factor} = 10^{\frac{A}{20}}.$$

Then:

$$\omega_b T/2 = \pi \cdot BW/Fs,$$

and $$\Omega_c = 2 \cdot \pi \cdot Fc/Fs.$$

Now, if a filter with a positive dB gain, i.e., having a linear gain of greater than one (known as a 'boost' filter), is to be designed, $\alpha_B$ is computed according to Equation (54) of the Zolzer and Boltze article, which can be rewritten by substituting from the above to be:

$$a_B = \frac{\tan(\pi BW/Fs) - 1}{\tan(\pi BW/Fs) + 1}$$

If a filter with a negative dB or fractional linear gain (known as a 'cut' filter) is to be used, the value $\alpha_C$ is computed according to Equation (55) of the Zolzer and Boltze article, which can be rewritten by substituting from above to be:

$$a_C = \frac{\tan(\pi BW/Fs) - V_0}{\tan(\pi BW/Fs) + V_0}$$

Equation (56) of the Zolzer and Boltze article is rewritten as:

$$d = -\cos(2\pi Fc/Fs)$$

$H_0$ is computed according to Equation (58) of the Zolzer and Boltze article:

$$H_0 = V_0 - 1$$

Figure 11:
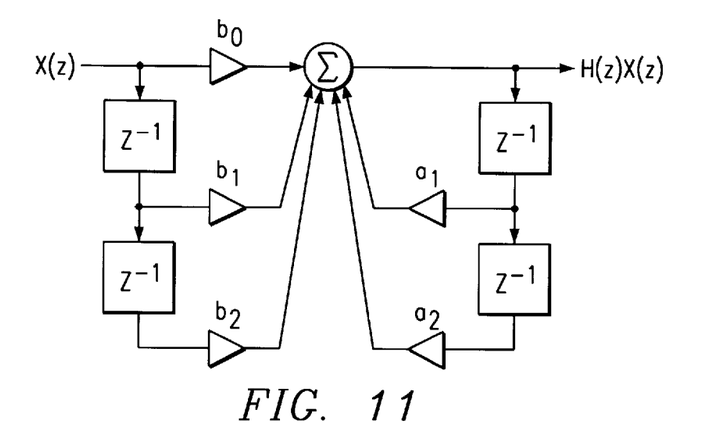
FIG. 11 is a diagram showing a five coefficient biquadratic discrete-time filter, in Direct form.

Referring to FIG. 11, which shows a five coefficient biquadratic discrete-time filter, in Direct form, the final filter transfer function is as in Equation (59) of the Zolzer and Boltze article:

$$H(z) = \frac{1 + (1 + a_{BC})\frac{H_0}{2} + d(1 - a_{BC})Z^{-1} + \left(-a_{BC} - (1 + a_{BC})\frac{H_0}{2}\right)Z^{-2}}{1 + d(1 - a_{BC})Z^{-1} - a_{BC}Z^{-2}}$$

Where $a_{BC}$ is $a_B$ for the boost case, or $a_C$ for the cut case. Those skilled in the art will recognize that this equation is a complex function and thus comprehends both phase and magnitude. Although only the speaker's magnitude response is being considered, the filters themselves are dealt with as complex functions, and so phase and magnitude interactions are dealt with in the derivation of the compensating filter scheme. Those skilled in the art will also recognize that the filter coefficients then have the following forms:

$$b_0 = 1 + (1 + a_{BC})\frac{H_0}{2}$$

$$b_1 = a_1 = d(1 - a_{BC})$$

$$b_2 = \left(-a_{BC} - (1 + a_{BC})\frac{H_0}{2}\right)$$

$$a_2 = -a_{BC}$$

Included below is a Matlab function for computing the coefficients in the manner indicated:

function $[B, A] = apcoef(A, BW, Fc, Fs)$ if A<1

$a = (\tan(pi*BW/Fs) - A)/(\tan(pi*BW/Fs) + A);$ else $a = (\tan(pi*BW/Fs) - 1)/(\tan(pi*BW/Fs) + 1);$ end $H = A - 1;$ $d = -\cos(2*pi*Fc/Fs);$ $b0 = 1 + (1+a)*H/2;$ $b1 = d*(1-a);$ $a1 = b1;$ $b2 = (-a - (1+a)*H/2);$ $a2 = -a;$ $B = [b0\ b1\ b2];$ $A = [1\ a1\ a2];$ As an example, let A=2, Fc=1000, BW=500, and Fs=44100:

$B = [b_0\ b_1\ b_2] = [1.03440794155482\ -1.91161634125903\ 0.89677617533555]$ $A = [1\ a_1\ a_2] = [1.00000000000000\ -1.91161634125903\ 0.93118411689037]$

The automatic loudspeaker equalizer algorithm of FIG. 10 operates as follows, with the optimizers being detailed below:

Step 1010

Figure 12:
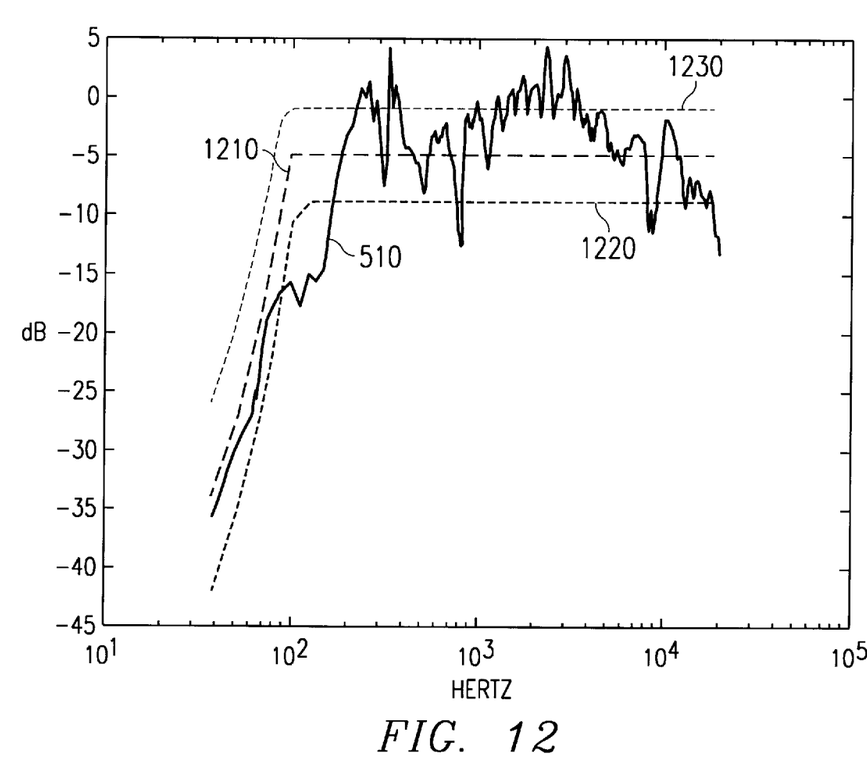
FIG. 12 is a graph showing a typical speaker response superimposed on a desired loudspeaker response and on response tolerance curves.

Input the recorded speaker characteristic curve 510, as shown in FIG. 12 (this is the same curve 510 as that shown in FIG. 5), in which the horizontal axis represents frequency in Hertz and the vertical axis represents sound level in decibels. This curve is input as digital data from the sound field measuring equipment 994 (FIG. 9). Also input the desired response curve 1210, as shown in FIG. 12. Generally, a flat response is desired over as much of the frequency range as possible, but the desired response curve 1210 should be chosen keeping in mind the physical limits of the loudspeaker under consideration. The desired response curve 1210 shown in FIG. 12, for example, represents a goal of flattening the response from 100 Hz up. Finally, the lower tolerance and the upper tolerance are input, as shown in FIG. 12 by the dotted line curves 1220 and 1230, respectively. The algorithm is capable of flattening the response to a relatively high degree. However, as a general matter the more the response is flattened, the more expensive the correction is in system resources used for the calculations. But, typically, deviations in sound level of less than two to three dB are not objectionable, and so only a small amount of correction, and thus a small amount of system resources are required. The tolerance range represented by the dotted line curves 1220 and 1230 is determined accordingly, so as to provide an acceptable amount of compensation to the speaker using an acceptable amount of system resources to accomplish the compensation.

Step 1020

Test to see if there are any regions in the (current) filter response curve that are beyond the tolerance levels, i.e., peaks.

Step 1030

If the result of step 1020 is negative, stop.

Step 1040

If the result of step 1020 is positive, use any of the aforementioned methods to find the largest peak, estimate the amplitude ("A"), center frequency ("Fc"), and the bandwidth ("BW"), of the filter needed to correct it.

Step 1050

Provide the information from step 1040 to a single filter optimizer subroutine, described below in conjunction with FIG. 13, which finds the single filter that best corrects this region of the curve.

Step 1060

Check to see if the number of filters is greater than one. If not, return to 1020.

Step 1070

If the number of filters is greater than one, provide the information from step 1040 to the joint filter optimizer subroutine, described below in conjunction with FIG. 14, to jointly optimize all current filters.

Step 1080

Has the maximum number of filters, FilterMax, been reached or is current speaker response completely within tolerance? If not, return to 1020. If either of the two conditions is met, go to step 1030, i.e., stop.

Figure 13:
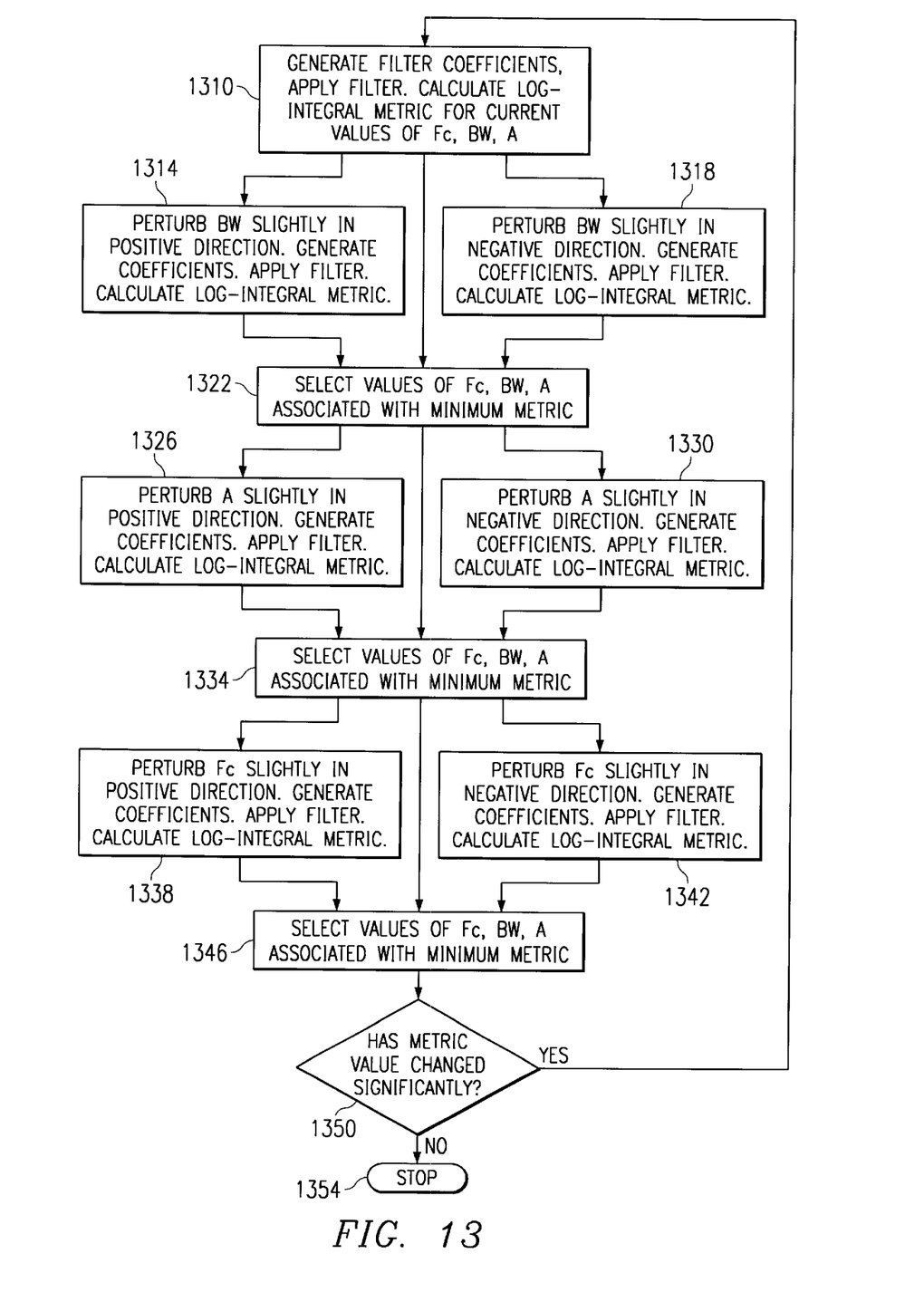
FIG. 13 is a flow chart showing a single filter optimizer.

The single filter optimizer operation referred to in step 1050 of FIG. 10 is shown in a flow chart in FIG. 13. It operates in the following manner:

Step 1310

Generate a second-order filter using the Orfanidis method mentioned above, or any other suitable method, from the initial values of Fc, BW, and A. Apply this filter to the filter characteristic and calculate the total log-integral metric of the deviation of the recorded speaker characteristic curve 510 from the desired response curve 1210. The total log-integral metric takes into account the fact that the human ear hears on an octave scale as opposed to a linear scale, and relates to the area between the recorded speaker characteristic curve 510, as modified by application of the designed filters, and the desired response curve 1210, where the vertical axis is in decibels and the horizontal axis is in the logarithm of the frequency. It is determined by the following formula:

$$M = \sum_{i=1}^{N-1} \log_{10}\left(\frac{f_{i+1}}{f_i}\right)\left[\frac{|S(f_i)_{dB} - D(f_i)_{dB}| + |S(f_{i+1})_{dB} - D(f_{i+1})_{dB}|}{2}\right]$$

where:

M is the total log-integral metric, f is the frequency,

D is the desired response characteristic,

S is the magnitude of the composite transfer function, comprised of the speaker characteristic, as modified by the designed filters, and N is the number of points in the characteristic.

Steps 1314 and 1318

Perturb the BW slightly in both the positive (step 1314) and in the negative (step 1318) directions. Generate new coefficients for each filter. Apply each filter in turn, and recalculate the total log-integral metric for each case. Alternatively, the results of a new measurement could be used instead of the calculated result of the application of a filter.

Step 1322

Select, from the original and the two perturbations the BW that produces the lowest total log-integral metric.

Steps 1326 and 1330

Perturb A slightly in the positive (step 1326) and negative (step 1330) directions. Generate new coefficients for each filter. Apply each filter in turn, and recalculate the total log-integral metric for each case.

Step 1334

Choose the value of A that produces the lowest total log-integral metric.

Steps 1338 and 1342

Perturb Fc slightly in the positive (step 1338) and negative (step 1342) directions. Generate new coefficients for each filter. Apply each filter in turn, and recalculate the total log-integral metric for each case.

Step 1346

Choose the value of Fc that produces the minimum total log-integral metric value.

Step 1350

Is the change in the metric greater than the change threshold? If it is, return to 1310 for further optimization.

Step 1354

If the change in the metric is not greater than the change threshold, stop. Single filter optimization is complete.

Figure 14:
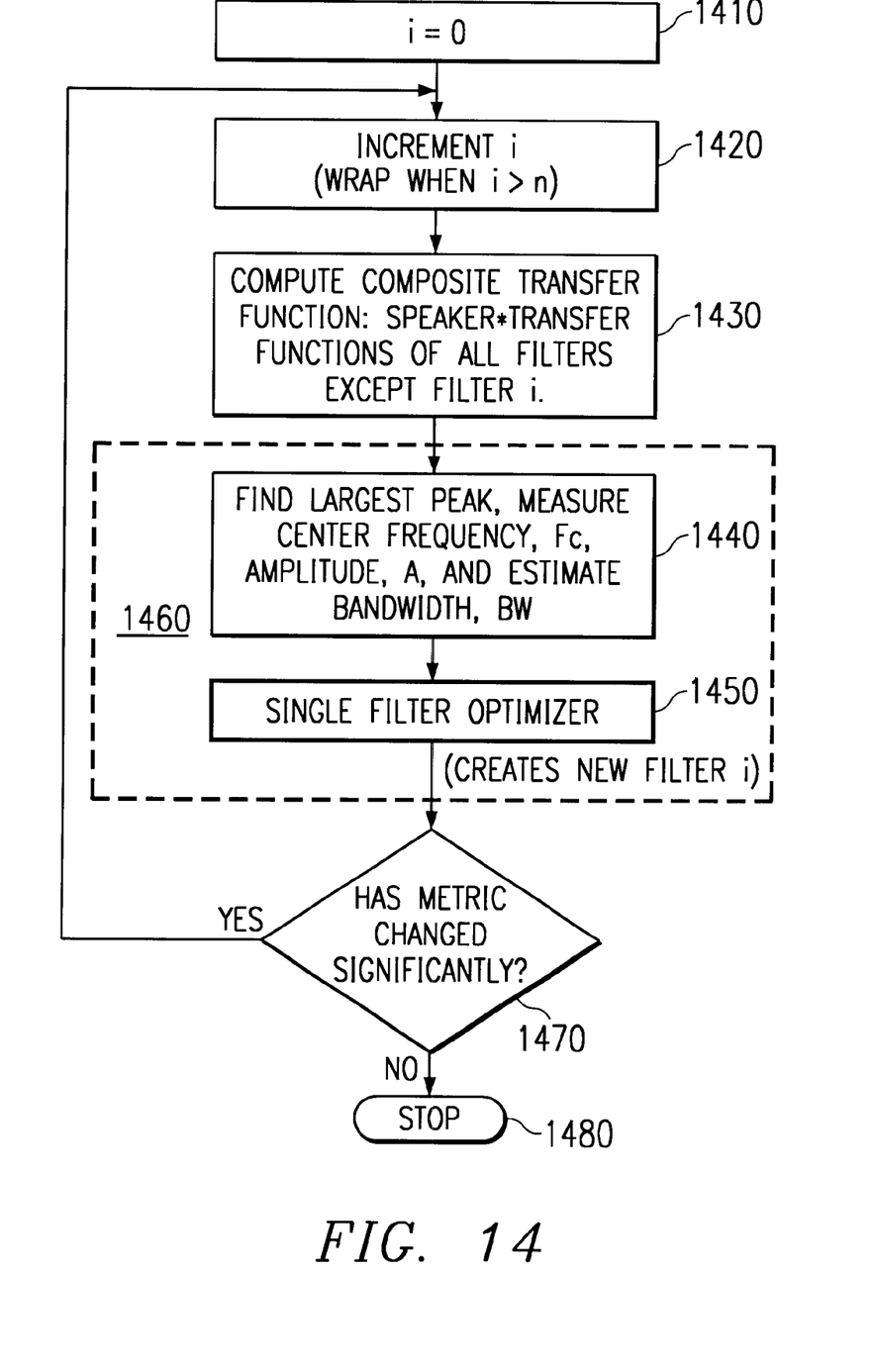
FIG. 14 is a flow chart showing a joint filter optimizer.

The joint filter optimizer operation referred to in step 1070 of FIG. 10 is shown in a flow chart in FIG. 14. It operates in the following manner:

Step 1410

Set i=0 to begin.

Step 1420

Increment i. If i becomes greater than the number of filters, n, make i=1.

Step 1430

Compute the composite transfer function including the uncompensated speaker response and responses for all but the $i^{th}$ filter. Alternatively, the results of a new measurement could be used instead of the computed composite transfer function.

Step 1460

Create a new $i^{th}$ filter as follows:

Step 1440

Find the largest peak in the composite response, estimate the amplitude, A, center frequency, Fc, and the bandwidth, BW, of the filter needed to correct it.

Step 1450

Generate coefficients and optimize the new filter using the single filter optimizer described above in conjunction with FIG. 13.

Step 1470

Check to see if the total filter metric has changed significantly with the application of the newly designed filter. If so, return to 1420 for further optimization.

Step 1480

If not, stop. Optimization is complete.

Figure 15:
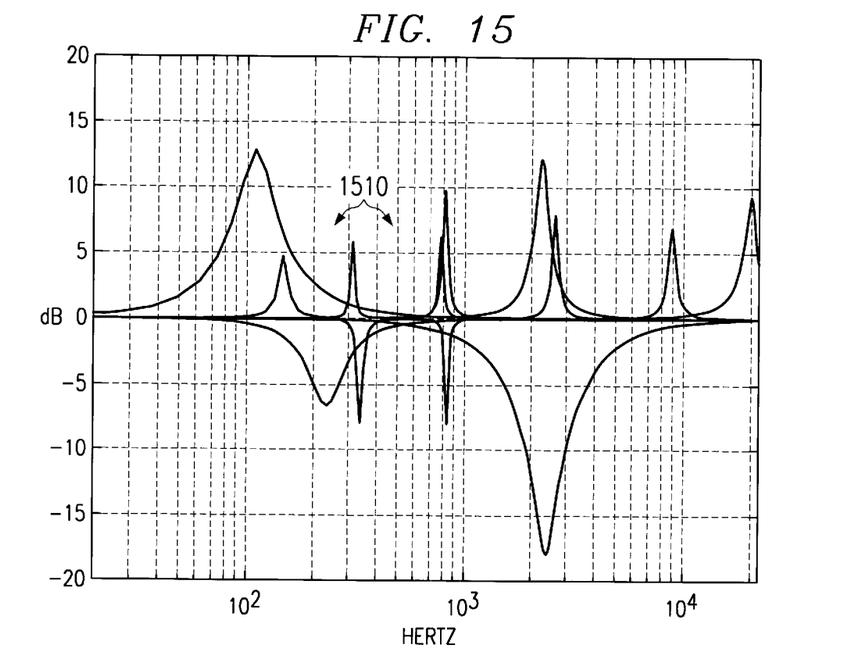
FIG. 15 is a graph showing equalization filter behavior.
Figure 16:
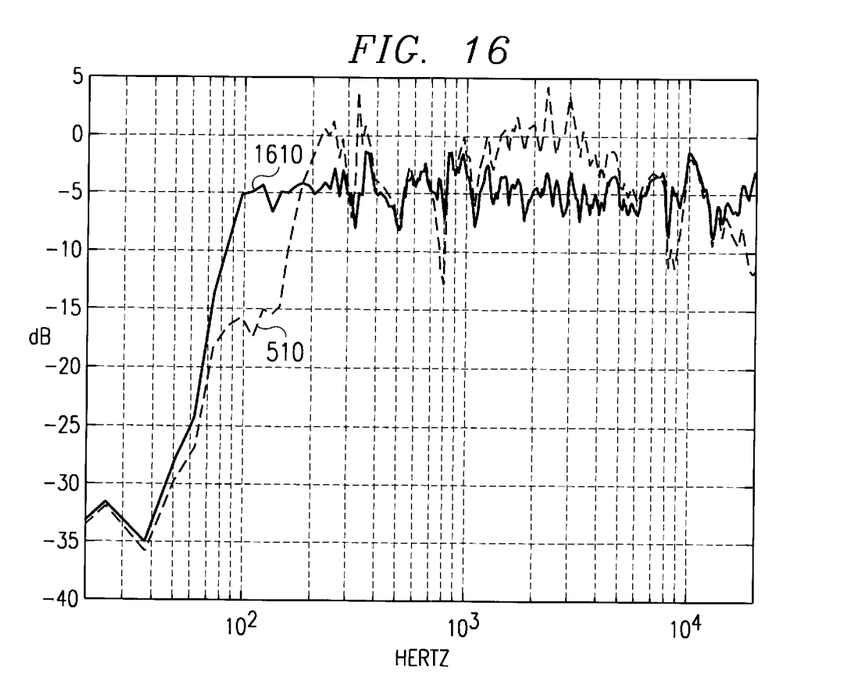
FIG. 16 is a graph showing a typical speaker response superimposed on a corrected loudspeaker response.

FIG. 15 is a graph, in which the horizontal axis represents frequency in Hertz and the vertical axis represents sound level in decibels, showing plots 1510 of equalization filters generated for the speaker response 510 shown in FIG. 12 by applying the method described above in conjunction with FIGS. 10–14. Thus, these plots 1510 were generated by the automatic loudspeaker equalizer algorithm of FIG. 10, using the typical speaker response 510 shown in FIG. 12, for a desired response 1210 shown in FIG. 12. Applying these filters produces the corrected response 1610 shown as a solid line in FIG. 16. FIG. 16 also shows the initial speaker response 510 from FIG. 12, for reference. Those skilled in the art will appreciate that the corrected response 1610 represents a considerably improved response over the initial speaker response 510.

Although the present invention and its advantages have been described in detail, it should be understood that various changes, substitutions and alterations can be made herein without departing from the spirit and scope of the invention as defined by the appended claims. For example, while the joint filter optimization subroutine 1070 discussed above in conjunction with FIGS. 10 and 14 is preferred, nonetheless, the principles of the present invention may be applied without a joint filter optimization procedure. Only a single filter optimization would be performed in such case. While the ultimate resulting compensation of the speaker would likely be less than that achievable by utilizing both a single filter optimization and a joint filter optimization, for example as shown in FIGS. 10, 13 and 14, nonetheless the reduction in resource requirements by omitting a joint filter optimization might be an overriding consideration to a designer. In addition, after deriving an initial set of compensating filters based solely upon the initial measured response data, then a new measurement could be made with these initial filters applied, and further optimization of those filters could then be performed and/or additional filters be designed. Other variations will occur to those skilled in the art once the principles of the present invention as set forth herein are understood. All such variations are to be considered within the scope of the invention, which is to be limited only by the claims set forth herein.

What is claimed is:

1. A method for generating digital filters for equalizing a loudspeaker, comprising the steps of:

providing first digital data for a tolerance range for a target response curve of sound level versus frequency for said loudspeaker;

providing second digital data for an actual response curve of sound level versus frequency for said loudspeaker;

comparing said first digital data to said second digital data and determining whether said actual response curve is within said tolerance range; and if said actual response curve is not within said tolerance range,
  iteratively generating digital audio filters,
  generating modified data relating to the response of said loudspeaker modified by said digital audio filters, and
  automatically optimizing the frequency, amplitude and bandwidth of said digital audio filters until said modified data is within said tolerance range or a predetermined limit on the number of digital audio filters has been reached, whichever occurs first.

2. A method according to claim 1, wherein
said step of generating modified data is performed by applying said digital audio filters to said second digital data to generate third digital data for a compensated response curve; and
said step of automatically optimizing the frequency, amplitude and bandwidth is performed by automatically optimizing the frequency, amplitude and bandwidth of said digital audio filters until said compensated response curve is within said tolerance range or a predetermined limit on the number of digital audio filters has been reached, whichever occurs first.

3. A method according to claim 1, wherein said step of generating modified data is performed by applying said digital audio filters and measuring the resulting response curve of sound level versus frequency for said loudspeaker.

4. A method according to claim 1, wherein said step of iteratively generating digital audio filters is performed by iteratively generating second-order filters.

5. A method for generating a set of second order filters to equalize a loudspeaker, comprising the steps of:
  providing first digital data for a tolerance range for a target response curve of sound level versus frequency for said loudspeaker;
  providing second digital data for an actual response curve of sound level versus frequency for said loudspeaker;
  comparing said first digital data to said second digital data and determining whether said actual response curve is within said tolerance range; and
  if said actual response curve is not within said tolerance range, generating a set of filters to equalize said loudspeaker by performing the following optimizing steps iteratively,
    digitally processing said second digital data to determine an $n^{th}$ set of initial parameters for an $n^{th}$ peak in said actual response curve where said actual response curve is not within said tolerance range, including a frequency, and amplitude and a bandwidth for said peak, where n is the number of an iteration of said optimizing steps,
    digitally generating a compensating $n^{th}$ filter from said $n^{th}$ set of initial parameters,
    applying said $n^{th}$ filter to said second digital data and modifying said $n^{th}$ set of initial parameters to determine an $n^{th}$ set of optimum parameters for said compensating $n^{th}$ filter, to generate third digital data for an $n^{th}$ interim compensated response curve of sound level versus frequency,
    processing said third digital data to determine whether said $n^{th}$ interim compensated response curve is within said tolerance range,
    if said $n^{th}$ interim compensated response curve is not within said tolerance range, performing another iteration of said optimizing steps until said interim compensated response curve is within said tolerance range or a predetermined limit on the number of filters has been reached, whichever occurs first.

6. A method according to claim 5, wherein said step of digitally generating a compensating $n^{th}$ filter is performed by digitally generating a second-order filter.

7. A method for generating filters for equalizing a loudspeaker, comprising the steps of:
  providing first digital data for a tolerance range for a target response curve of sound level versus frequency for said loudspeaker;
  providing second digital data for an actual response curve of sound level versus frequency for said loudspeaker;
  comparing said first digital data to said second digital data and determining whether said actual response curve is within said tolerance range; and
  if said actual response curve is not within said tolerance range, generating a set of compensating filters by performing the following single filter optimizing steps iteratively,
    digitally processing said second digital data to determine an $n^{th}$ set of initial parameters for an $n^{th}$ peak in said actual response curve where said actual response curve is not within said tolerance range, including a frequency, an amplitude and a bandwidth for said peak, where n is the number of an iteration of said optimizing steps,
    digitally generating a compensating $n^{th}$ filter from said $n^{th}$ set of initial parameters,
    applying said $n^{th}$ filter to said second digital data and modifying said $n^{th}$ set of initial parameters to determine an $n^{th}$ set of optimum parameters for said $n^{th}$ filter, to generate third digital data for an $n^{th}$ interim compensated response curve of sound level versus frequency;
  if n>1, performing the following joint filter optimizing steps iteratively and cyclically,
    generating fourth digital data for interim computed response curves in which for each joint filter optimizing iteration one of said n filters is absent, and then performing said single filter optimization steps utilizing said fourth digital data to generate fifth digital data for an updated interim response curve,
    digitally processing said fifth digital data to determine whether the most recent of said joint filter optimizing iterations has resulted in a change in said updated interim response curve greater than a predetermined amount of change, and if so continuing to perform said joint filter optimizing steps;
  processing said fifth digital data to determine whether said $n^{th}$ interim compensated response curve is within said tolerance range,
  and if not,
    performing another iteration of the foregoing steps until said interim compensated response curve is within said tolerance range or a predetermined limit on the number of filters has been reached, whichever occurs first,
  but if so, ceasing performance of further iterations.

8. A method according to claim 7, wherein said step of digitally generating a compensating $n^{th}$ filter is performed by digitally generating a second-order filter.

9. A method for generating filters for equalizing a loudspeaker, comprising the steps of:
  providing a source of first audio digital data;
  providing a digital audio processing unit for processing said first audio digital data and providing processed audio digital data, including applying digital audio filters for equalizing said loudspeaker characterized by coefficients in algorithms applied to said first audio digital data to effect said digital audio filters;

providing a digital to analog converter for converting said processed audio digital data to an analog audio signal for provision to said loudspeaker;

providing a sound field measuring device in the vicinity of said loudspeaker to generate second audio digital data representing sound produced by said loudspeaker;

providing a digital computer connected to receive said second audio digital data, and programming said digital computer to determine said coefficients for digital filters for equalizing a loudspeaker and provide said coefficients to said digital audio processing unit by providing third digital data for a tolerance range for a target response curve of sound level versus frequency for said loudspeaker;

providing said second digital data, wherein said second digital data represents an actual response curve of sound level versus frequency for said loudspeaker;

comparing said third digital data to said second digital data and determining whether said actual response curve is within said tolerance range; and if said actual response curve is not within said tolerance range, iteratively generating digital audio filters by iteratively generating coefficients for said digital audio filters, applying said digital audio filters determined by said coefficients to said second digital data to generate fourth digital data for a compensated response curve, and automatically optimizing said coefficients until said compensated response curve is within said tolerance range or a predetermined limit on the number of digital audio filters has been reached, whichever occurs first.

10. An method according to claim 9, wherein said digital computer is programmed to determine said coefficients by automatically optimizing said coefficients by optimizing the frequency, amplitude and bandwidth of said digital audio filters.

11. An apparatus for generating filters for equalizing a loudspeaker, comprising:

a source of first audio digital data;

a digital audio processing unit for processing said first audio digital data and providing processed audio digital data, including applying digital audio filters for equalizing said loudspeaker characterized by coefficients in algorithms applied to said first audio digital data to effect said digital audio filters;

a digital to analog converter for converting said processed audio digital data to an analog audio signal for provision to said loudspeaker; a sound field measuring device in the vicinity of said loudspeaker to generate second audio digital data representing sound produced by said loudspeaker;

a digital computer connected to receive said second audio digital data, and programmed to determine said coefficients for digital filters for equalizing a loudspeaker and provide said coefficients to said digital audio processing unit, said digital computer being programmed to determine said coefficients by providing third digital data for a tolerance range for a target response curve of sound level versus frequency for said loudspeaker;

providing said second digital data, wherein said second digital data represents an actual response curve of sound level versus frequency for said loudspeaker;

comparing said third digital data to said second digital data and determining whether said actual response curve is within said tolerance range; and if said actual response curve is not within said tolerance range, iteratively generating digital audio filters by iteratively generating coefficients for digital audio filters, applying digital audio filters determined by said coefficients to said second digital data to generate fourth digital data for a compensated response curve, and automatically optimizing said coefficients until said compensated response curve is within said tolerance range or a predetermined limit on the number of digital audio filters has been reached, whichever occurs first.

12. An apparatus according to claim 11, wherein said digital computer is programmed to determine said coefficients by automatically optimizing said coefficients by optimizing the frequency, amplitude and bandwidth of said digital audio filters.

13. A method for generating digital filters for equalizing a loudspeaker, comprising the steps of:

providing first digital data for a tolerance range for a target response curve of sound level versus frequency for said loudspeaker;

providing second digital data for a first actual response curve of sound level versus frequency for said loudspeaker;

comparing said first digital data to said second digital data and determining whether said first actual response curve is within said tolerance range; and if said first actual response curve is not within said tolerance range, iteratively generating digital audio filters to compensate said actual response curve, applying said digital audio filters to said first digital data to generate third digital data, converting said third digital data to an analog signal and providing said analog signal to said loudspeaker, generating fourth digital data for a second actual response curve of sound level from said analog signal versus frequency for said loudspeaker;

comparing said first digital data to said fourth digital data and determining whether said second actual response curve is within said tolerance range; and automatically optimizing the frequency, amplitude and bandwidth of said digital audio filters until said second actual response curve is within said tolerance range or a predetermined limit on the number of digital audio filters has been reached, whichever occurs first.

14. A method according to claim 13, wherein said step of iteratively generating digital audio filters is performed by iteratively generating second-order filters.

15. A method for generating total log-integral metric digital data for characterizing the perceived performance of a loudspeaker, comprising the steps of:

providing first digital data for N samples for a desired response curve of sound level versus frequency for said loudspeaker;

providing second digital data for N samples for an actual response curve of sound level versus frequency for said loudspeaker; and generating total log-integral metric data according to the formula:

$$M = \sum_{i=1}^{N-1} \log_{10}\left(\frac{f_{i+1}}{f_i}\right)\left[\frac{|S(f_i)_{dB} - D(f_i)_{dB}| + |S(f_{i+1})_{dB} - D(f_{i+1})_{dB}|}{2}\right]$$

where:
M is the total log-integral metric,
f is the frequency,
D is the first digital data,
S is the second digital data, and
N is the number of samples of first digital data and of second digital data.

16. A method for generating digital filters for equalizing a plurality of loudspeakers, comprising the steps of:

providing first digital data for a tolerance range for a target response curve of sound level versus frequency for said loudspeakers;

providing second digital data for an actual response curve of sound level versus frequency for said loudspeakers;

comparing said first digital data to said second digital data and determining whether said actual response curve is within said tolerance range; and if said actual response curve is not within said tolerance range,
iteratively generating digital audio filters,
applying said digital audio filters to said second digital data to generate third digital data for a compensated response curve, and automatically optimizing the frequency, amplitude and bandwidth of said digital audio filters until said compensated response curve is within said tolerance range or a predetermined limit on the number of digital audio filters has been reached, whichever occurs first.

* * * * *